United States Patent [19]

Sugai et al.

[11] Patent Number: 4,879,487

[45] Date of Patent: Nov. 7, 1989

[54] SURFACE-ACOUSTIC-WAVE DEVICE

[75] Inventors: Kazuyoshi Sugai; Kiyotaka Sato; Hiroshi Nishizato, all of Tokyo, Japan

[73] Assignee: Clarion Co., Ltd., Tokyo, Japan

[21] Appl. No.: 196,123

[22] Filed: May 19, 1988

[30] Foreign Application Priority Data

May 26, 1987 [JP] Japan .............................. 62-130618
May 26, 1987 [JP] Japan .............................. 62-130619

[51] Int. Cl.$^4$ .......................................... H01L 41/08
[52] U.S. Cl. ............................. 310/313 A; 310/313 B; 310/313 D; 333/154; 333/193
[58] Field of Search ..................... 310/313 A, 313 D; 313/154, 193

[56] References Cited

U.S. PATENT DOCUMENTS

| | | | |
|---|---|---|---|
| 4,005,376 | 1/1977 | Davis | 310/313 A X |
| 4,449,107 | 5/1984 | Asai et al. | 310/313 A X |
| 4,480,209 | 10/1984 | Okamoto et al. | 310/313 B |
| 4,567,393 | 1/1986 | Asai et al. | 310/313 A |

FOREIGN PATENT DOCUMENTS 0171823  9/1985  Japan .................................. 333/195

Primary Examiner—Mark O. Budd
Attorney, Agent, or Firm—Flynn, Thiel, Boutell & Tanis

[57] ABSTRACT

A surface-acoustic-wave device includes a glassy layer provided on a piezoelectric layer and having periodic grooves (gratings) so as to be used as a reflector exhibiting an excellent reflection ratio.

6 Claims, 6 Drawing Sheets

SURFACE-ACOUSTIC-WAVE DEVICE

FIELD OF THE INVENTION

This invention relates to a surface-acoustic-wave device having a piezoelectric film on a semiconductor substrate, and more particularly to an improvement of a surface-acoustic-wave reflector which is an important element of a resonator, oscillator, dispersive delay line, etc. and an improvement of a surface-acoustic-wave device for an resonator.

BACKGROUND OF THE INVENTION

It is known that application of a periodic perturbation to a surface of a surface-acoustic-wave substrate provides a grating which functions as a surface-wave reflector having a frequency selecting property.

Prior art surface-wave reflectors of this type are a strip-type reflector having a metal or other film, group-type reflector having grooves on one surface thereof, ion-implanted reflector, etc.

The strip-type reflector may be an arrangement using a film of Au or other heavy metal to mainly utilize its mass load effect or utilize the electric field short-circuit effect ($\Delta v/v$ effect) of the metal film or an arrangement using a relatively thick film of Al or other metal or an insulator to utilize the geometric perturbation effect of a ridge.

However, the use of the Au or other heavy metal film strip, although expensive, does not provide a large reflection ratio per one grating. The electric field short-circuit effect is not expected unless the material has a large electromechanical coupling coefficient $k^2$. The geometric perturbation effect of a ridge is absolutely determined by the elastic properties of the ridge and the substrate, and the light-metal film normally made from Al does not exhibit a large reflection ratio.

The group-type reflector which provides a relatively large reflection ratio is used widely. However, this reflector is not effective unless using a material which facilitates an etching for providing grooves. The most popular etching is a dry etching such as reactive ion etching enabling an anisotropic etching.

The ion-implanted reflector has a relatively small perturbation and a relatively small reflection ratio.

Therefore, these surface-wave reflectors are not satisfactory in viewpoints of productivity and reflection property.

Most prior art resonators including a piezoelectric film use a ZnO or AlN (aluminum nitride) piezoelectric film has the following disadvantages among others:

(1) An electrical instability occurs upon application of a voltage;
(2) It is difficult to form a qualified film;
(3) A protective film ($SiO_2$) is required on a silicon single-crystalline substrate;
(4) The propagation loss of a surface acoustic wave is large in high frequency ranges; and
(5) It does not match a normal silicon IC process.

Therefore, an AlN film is preferred particularly as a piezoelectric film for circuit integration into a single chip.

As an example providing a resonator using an AlN film on a silicon single-crystalline substrate, there is a report (L. G. Piearce et al., Appln. Phys. Letl Vol 39(1981) Dec., Vo. 11, (New York, U.S.A.) which discloses application of an AlN film to a two-port resonator.

The resonator has an $AlN/SiO_2/Si$ arrangement in which its grating reflector consists of four hundred short-circuited Au strips.

It is reported that the resonator exhibits properties of resonance frequency: 121.7 MHz, insertion loss: 27 dB and quality factor: 3370. These are not sufficient properties.

Thus it is very difficult to obtain a small-scaled, excellent-property resonator, using the prior art arrangements.

OBJECT OF THE INVENTION

It is therefore an object of the invention to provide a surface-acoustic-wave multi-layer element including a piezoelectric film which element can be manufactured easily to form a surface-acoustic-wave reflector having an excellent reflection ratio.

A further object of the invention is to provide a surface-acoustic-wave device for use in a resonator which device is suitable for incorporation of a surface-acoustic-wave element and its peripheral circuits into a single chip.

SUMMARY OF THE INVENTION

In order to achieve the objects, an inventive device includes a glassy layer provided on a piezoelectric layer on a semiconductor substrate and includes a plurality of periodic grooves which extend across the propagating direction of surface acoustic waves on the surface of the glassy layer.

The glassy layer may be made from a silicon dioxide ($SiO_2$), phosphoric silicic acid glass (PSG), boron silicic acid glass (BSG), boron phosphoric silicic acid (BPSG), etc.

The periodic grooves provided on the surface of the glassy layer effect an excellent reflection of surface acoustic waves. Further, stationary waves of the surface acoustic waves are produced between the electrode and the grooves and are detected by the electrode.

DETAILED DESCRIPTION

Figure 1:
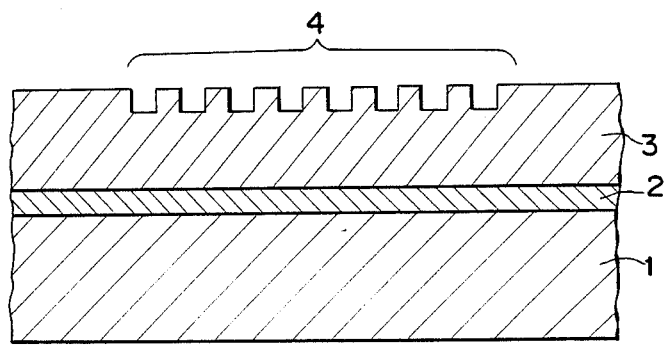
FIG. 1 is a longitudinal cross-sectional view of a major part of a surface-acoustic-wave device embodying the invention.

FIG. 1 shows an embodiment of the invention in which reference numeral 1 refers to a semiconductive single-crystalline substrate, 2 to a piezoelectric layer provided on one surface of the substrate 1, 3 to a silicon dioxide layer provided on the piezoelectric layer 2, and 4 to periodic grooves provided on the exposed surface of the silicon dioxide layer 3. They all form a surface-acoustic-wave reflector.

When a surface acoustic wave enters in the arrangement of FIG. 1, the periodic grooves reflect it. In frequencies in which the cycle of the grooves is an integer times the half of the wavelength of the surface wave, all reflected waves are in-phase, and the inventive device operates as an excellent reflector.

One of structural merits of the aforegoing surface-acoustic-wave reflector is that an excellent reflector is obtained by also providing a silicon dioxide layer also on the surface of a chemically, physically stable material such as AlN piezoelectric film and providing grooves on the surface. When the silicon dioxide film has a thickness above a certain value, the characteristic of the silicon dioxide layer determines the reflection ratio of the grooves, substantially regardless of the characteristic of the base material. The grooves formed on the surface of the silicon dioxide film exhibit a significantly large reflection ratio.

The silicon dioxide layer enables an anisotropic etching with a small undercut, by using the aforementioned reactive ion etching (RIE). Thus the silicon dioxide layer facilitates the groove-making and improves the temperature characteristic of surface acoustic waves.

In the prior art technology, when a surface-acoustic-wave element having an AlN piezoelectric film on a silicon single-crystalline substrate was used to form a reflector, groove-making etching was difficult because AlN is stable chemically and physically. Therefore, the reflector was made of metal film strips. Additionally, it was most advantageous to form a ridge by a relatively thick Al (aluminum) film. However, the reflection ratio of the reflector obtained by the Al ridge is very small.

Figure 2:
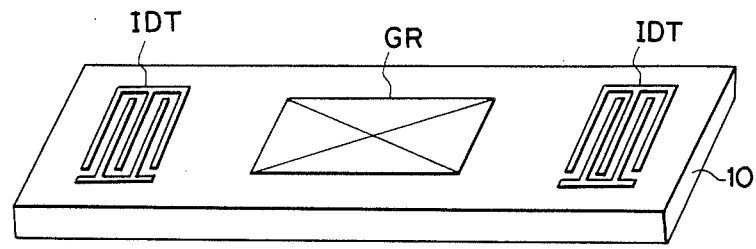
FIG. 2 is a perspective view of a surface-acoustic-wave element for evaluation its reflecting ratio.
Figure 3:
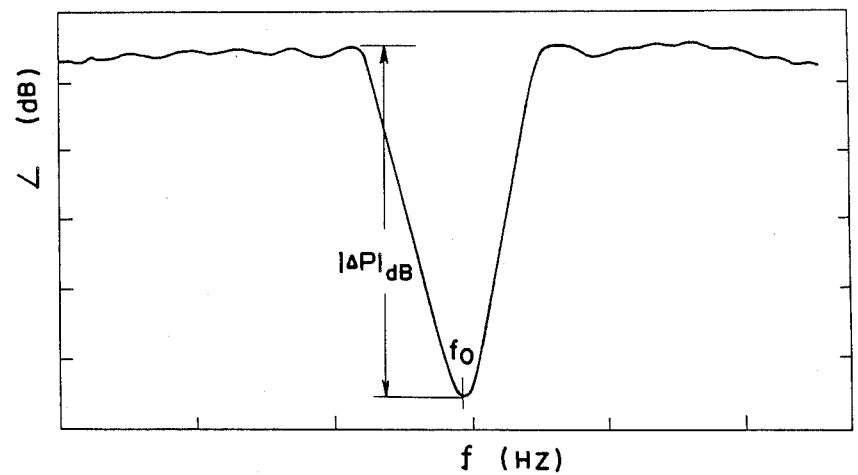
FIG. 3 is a transmission property graph of the element.

A method shown in FIG. 2 is generally used for evaluation of the reflection ratio of the reflector. More specifically, a piezoelectric elastic substrate 10 is provided with input and output transducers IDT, and a grating reflector GR including N pieces of gratings is provided between the transducers IDT. The transmission characteristic of the surface-acoustic-wave element is shown in FIG. 3 as a graph of the frequency f and the insertion loss L. There is the following relationship among the attenuation amount $|\Delta P|$, pieces of gratings N and the reflection ratio $|P|$ of one grating:

$$|\Delta P| = 8.686 N |P| - 6.02 \text{ (dB)}$$

From this equation, the reflection ratio $|P|$ can be evaluated by measuring $|\Delta P|$.

Particular examples are taken below to compare the prior art surface-acoustic-wave reflector and some inventive surface-acoustic-wave reflectors.

Figure 4:
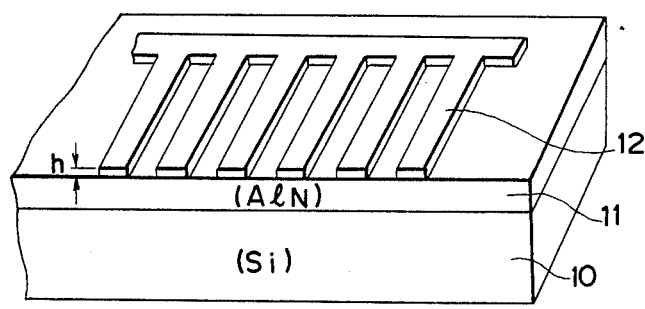
FIG. 4 is a perspective view of a major part of a prior art reflector used for evaluation of its reflection ratio.

For example, when the reflector, as shown in FIG. 4, consists of a Si(100)-cut substrate 10, a 5000 Å-thick AlN film 11 on the substrate 10, transducers IDT (not shown) on the AlN film 11 and ridges 12 in the form of an Al film to form gratings, evaluation of the reflector using a surface acoustic wave of wavelength 32 μm and the AlN film having thickness h not exceeding about 1.2 μm results in the reflection ratio $|P|$ per one grating. This is a poor result as shown by the dotted line in the graph of FIG. 5.

This is uniformly determined by the elastic characteristics of the Al/AlN/Si arrangement. In FIG. 4, h denotes the height of the Al ridges (depth of the grooves), and λ is the wavelength of a surface acoustic wave.

The present invention is particularly effective when the groove-making is difficult, and a sufficiently large reflection ratio is not obtained by a film of Al or other metal.

Figure 5:
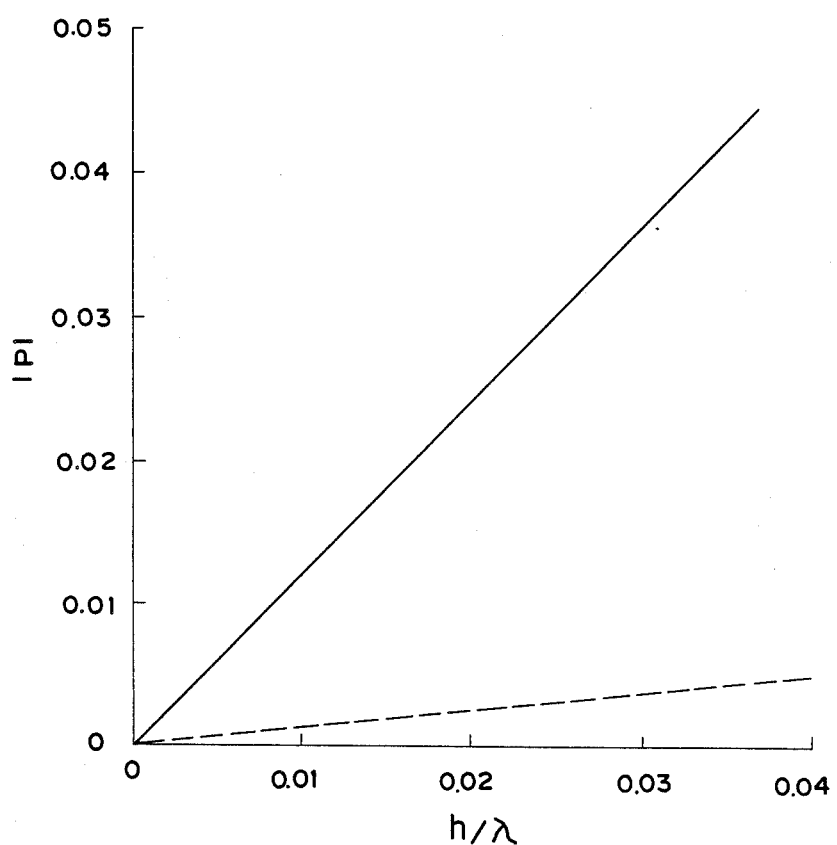
FIG. 5 is a graph showing the reflection ratio property of the reflector.

When the surface acoustic reflector consists of a Si(100)-cut substrate, a 5000 Å-thick AlN film on the substrate, a 2.3 μm-thick PSG (phosphoric silicic acid glass) on the AlN film 11, and grooves formed by partly removing the surface of the PSG by the aforegoing RIE groove-making method, evaluation of the reflector using a surface acoustic wave of wavelength 32 μm results in the satisfactory large reflection ratio shown by the solid line in FIG. 5. Thus the reflector formed on the surface of the PSG film ensures a reflection ratio ten times the reflection ratio of the reflector made by the Al film ridges.

Figure 6:
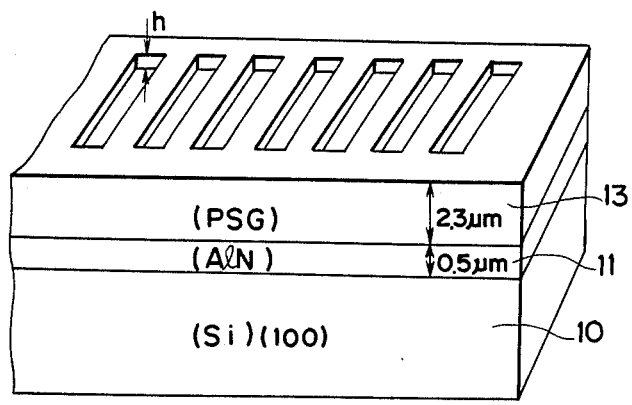
FIG. 6 is a fragmentary perspective view of an inventive reflector used for evaluation of its reflection ratio.
Figure 7:
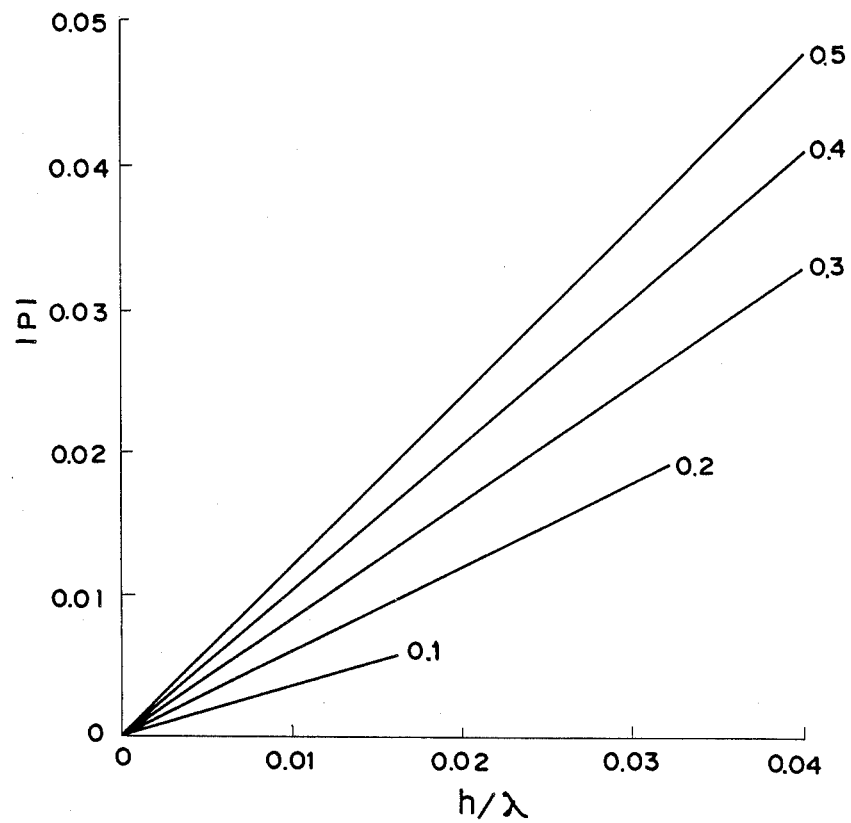
FIG. 7 is a graph showing the reflection ratio property of the reflector.

When the reflector, as shown in FIG. 6, consists of a Si(100)-cut substrate 10, an AlN film 11 on the substrate 10, a PSG film 13 on the AlN film 11 and gratings of depth h formed by partly removing the PSG film 13, evaluation of the relationship between $2\pi H/\lambda$ and the reflection ratio under thickness H of the PSG film results in the graph of FIG. 7. That is, as the thickness of the PSG film increases and causes $2\pi H/\lambda$ to increase from 0.1 to 0.5, the reflection ratio $|P|$ per one grating increases. The increase of the reflection ratio, although small in $2\pi H/\lambda > 0.5$, is continued until reaching about $2\pi H/\lambda \approx 1$. The PSG film 13 had better be thick in the evaluated range. However, by selecting a thickness in the range of $2\pi H/\lambda > 0.1$, a practically acceptable reflection ratio is obtained.

Figure 8:
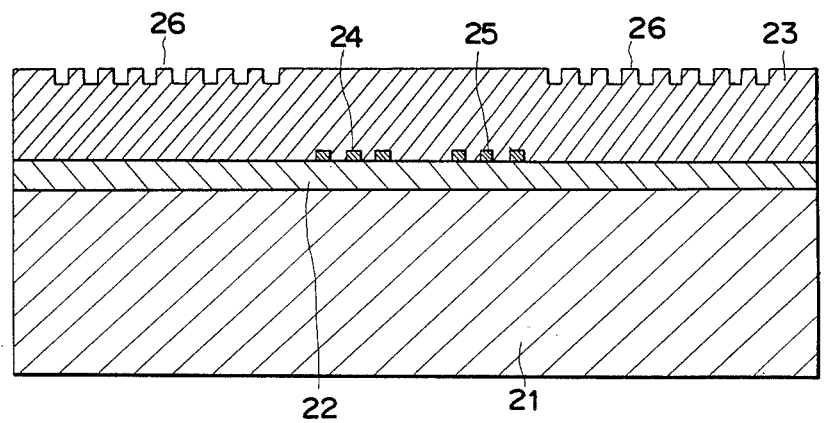
FIG. 8 is a longitudinal cross-sectional view of a surface-acoustic-wave resonator which is a further embodiment of the invention.
Figure 9:
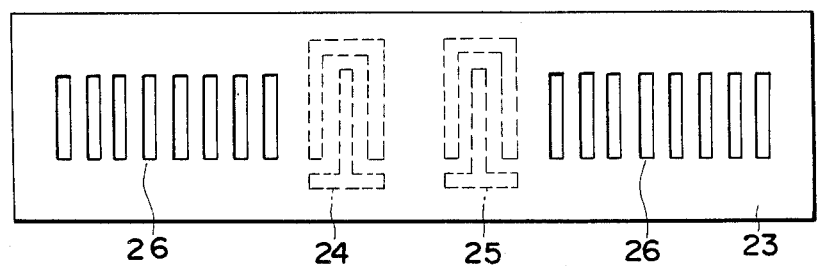
FIG. 9 is a plan view of the same resonator.

FIGS. 8 and 9 show an embodiment of the invention used in a two-port resonator in which reference numeral 21 refers to a silicon single-crystalline substrate, 22 to an AlN piezoelectric film provided on the substrate 21, 23 to a silicon dioxide layer provided on the AlN piezoelectric layer 22. Reference numerals 24 and 25 denote comb-shaped electrodes provided between the AlN piezoelectric layer 22 and the silicon dioxide layer 23 to generate and detect surface acoustic waves. Reference numeral 26 designates arrays of periodic grooves provided on the surface of the silicon dioxide layer 23 to reflect surface acoustic waves. The groove arrays are located at opposite sides of the input and output electrodes 24 and 25.

A surface acoustic wave generated in the electrode 24 or 25 travels in opposite directions from the electrode, and is efficiently reflected by the grooves 26 spaced by a cycle which is about integer times the half wavelength of the surface acoustic wave. As a result, stationary waves of the surface acoustic wave are produced between respective groove arrays and are detected by the electrode 24 or 25.

Figure 10:
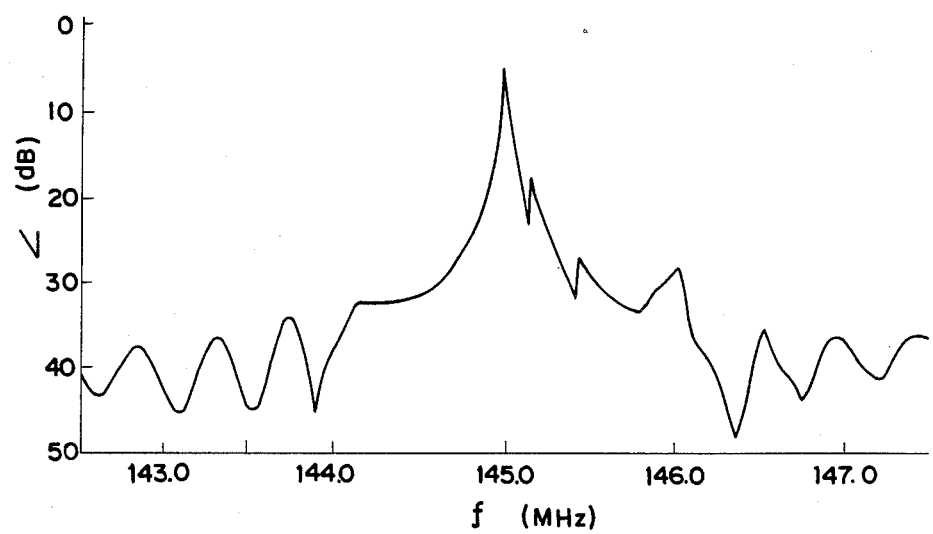
FIG. 10 is a graph showing the transmission property of the resonator.
Figure 11:
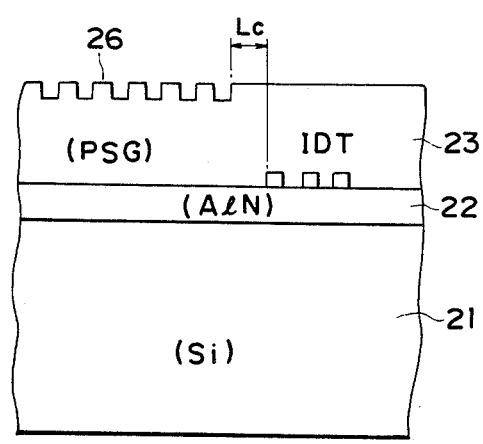
FIG. 11 is a view for explanation of a resonator arrangement.

The graph of FIG. 10 shows the transmission characteristic of a two-port resonator having the arrangement shown in FIG. 11. More specifically, the two-port resonator consists of a Si(100)-cut substrate 21, a 0.5 μm thick AlN piezoelectric layer 22 on the substrate 21 and a 2.5 μm-thick PSG (phosphoric silicic acid glass) provided on the AlN piezoelectric layer 22. Transducers IDT used as electrodes 24 and 25 are made from Al. The wavelength of a surface acoustic wave is 32 μm, the travelling direction of the surface acoustic wave is Si [100], and the depth of reflection grooves 26 is about 5000 Å.

The aforegoing resonator exhibits the following characteristics:
  resonance frequency: 145 MHz
  insertion loss: 5 dB
  loaded Q: 4000
where the number of pairs of IDT is 16, electrode interdigitating width is 1 mm, the number of grooves is 230, and the distance between the center of respective IDT's is 20λ (λ is the wavelength of the surface acoustic wave), and the distance (Lc) between IDT and one end of the groove is about $\frac{5}{8}\lambda$.

In the aforegoing resonator having a PSG/AlN/Si arrangement, the condition of Lc=$\frac{5}{8}\lambda$ (about $\frac{3}{8}\lambda$ in case of grooves in prior art arrangements) is very important for efficient coupling of stationary waves of the surface acoustic wave.

Figure 12:
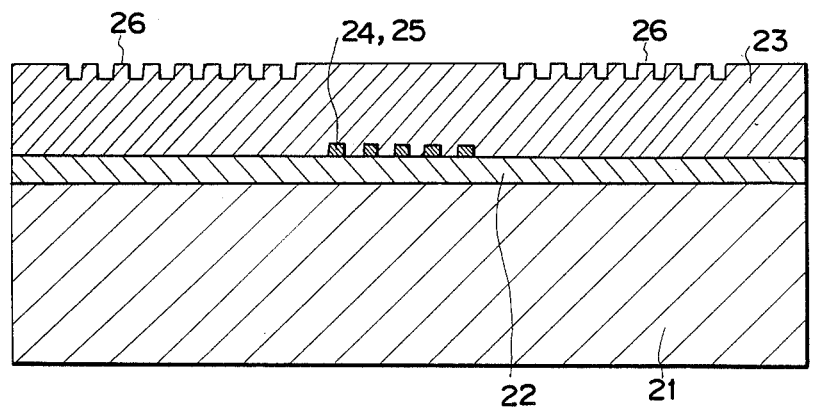
FIG. 12 is a longitudinal cross-sectional view of a further inventive surface-acoustic-wave resonator.
Figure 13:
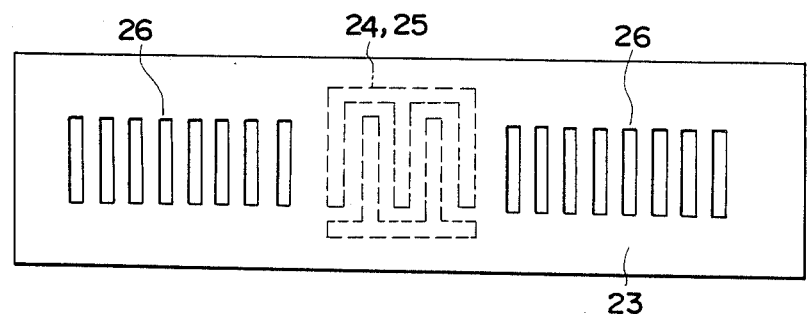
FIG. 13 is a plan view of the same resonator.

FIGS. 12 and 13 of a further embodiment of the invention used in one-port resonator.

As described above, since the inventive surface-acoustic-wave reflector or resonator is made by providing a glassy layer on a piezoelectric layer on a semiconductor single-crystalline substrate and by providing periodic grooves extending across the surface acoustic wave travelling direction, it is possible to obtain a reflector exhibiting an excellent reflection ratio or a surface-acoustic-wave device exhibiting an excellent resonance characteristic as compared to the prior art devices.

What is claimed is:

1. A surface-acoustic-wave device comprising:
  a semiconductor substrate;
  a piezoelectric layer provided on one surface of said semi-conductor substrate;
  a glassy layer provided on one surface of said piezoelectric layer on a side of said piezoelectric layer remote from said substrate; and
  a plurality of grooves which are spaced periodically and which are provided in a surface of said glassy layer located on a side thereof remote from said piezoelectric layer, said grooves extending transversely with respect to a surface acoustic wave travelling direction.

2. A surface-acoustic-wave device according to claim 1 wherein said semiconductor substrate is made from silicon single crystal, said piezoelectric layer is made from aluminum nitride (AlN), and said glassy layer is made from $SiO_2$, phosphoric silicic acid glass, boron silicic acid glass or boron-phosphoric silicic acid glass.

3. A surface acoustic wave device according to claim 1 wherein said glassy layer has a thickness H with respect to the wavelength λ of a surface acoustic wave which satisfies:

$2\pi H/\lambda > 0.1$

4. A surface acoustic wave device comprising:
  a semiconductor substrate;
  a piezoelectric layer provided on one surface of said semi-conductor substrate;
  a glassy layer provided on one surface of said piezoelectric layer on a side of said piezoelectric layer remote from said substrate;
  electrode means provided on said one surface of said piezoelectric layer for producing an detecting a surface acoustic wave; and
  two arrays of grooves provided on one surface of said glassy layer on a side thereof remote from said piezoelectric layer at spaced positions located on opposite sides of said electrode means.

5. A surface acoustic wave device according to claim 4 wherein the distance Lc between opposed ends of each said electrode and each said array of grooves is Lc≈$(\frac{5}{8})\lambda$ with respect to the wavelength λ of a surface acoustic wave.

6. A surface acoustic wave according to claim 4 wherein said piezoelectric layer is made from AlN.

* * * * *